(12) United States Patent
Wu et al.

(10) Patent No.: US 10,965,264 B2
(45) Date of Patent: Mar. 30, 2021

(54) BIAS CIRCUIT FOR SUPPLYING A BIAS CURRENT TO AN RF POWER AMPLIFIER

(71) Applicant: Rafael Microelectronics, Inc., Hsinchu County (TW)

(72) Inventors: Chih-Wen Wu, Hsinchu County (TW); Po Chang Lin, Hsinchu County (TW); Chun Hua Tseng, Hsinchu County (TW)

(73) Assignee: Rafael Microelectronics, Inc., Hsinchu County (TW)

( * ) Notice: Subject to any disclaimer, the term of this patent is extended or adjusted under 35 U.S.C. 154(b) by 62 days.

(21) Appl. No.: 16/402,243

(22) Filed: May 3, 2019

(65) Prior Publication Data
US 2020/0350881 A1 Nov. 5, 2020

(51) Int. Cl.
| | |
|---|---|
| *H03F 3/04* | (2006.01) |
| *H03G 3/30* | (2006.01) |
| *H03F 3/217* | (2006.01) |
| *H03F 3/193* | (2006.01) |

(52) U.S. Cl.
CPC ........... *H03G 3/3042* (2013.01); *H03F 3/193* (2013.01); *H03F 3/217* (2013.01); *H03F 2200/18* (2013.01)

(58) Field of Classification Search
CPC ....... H03G 3/3042; H03F 3/217; H03F 3/193; H03F 2200/18; H03F 1/0266; H03F 1/3223; H03F 3/211; H03F 3/189; H03F 2200/102; H03F 3/20; H03F 3/68; H03F 1/301; H03F 1/302; H03F 3/04; H02M 7/04
USPC ............... 330/296, 298, 51, 285, 277, 207 P
See application file for complete search history.

(56) References Cited

PUBLICATIONS

No 1449 forms nor any references have been submitted by the Applicants.*

* cited by examiner

*Primary Examiner* — Khanh V Nguyen
*Assistant Examiner* — Khiem D Nguyen
(74) *Attorney, Agent, or Firm* — Min-Lee Teng; Litron Patent & Trademark Office

(57) ABSTRACT

A bias circuit generates a bias current to an RF power amplifier used for transmitting RF signals, and the amount of the bias current supplied to the RF power amplifier can be configured in multiple modes through transistor switches that are controlled by mode control signals, so that the bias current supplied to the RF power amplifier can be adjusted according to the required power level of the transmitting RF signals. In addition, the bias current can be turned off by another transistor switch that is controlled by a power control signal for saving power while the RF power amplifier is not transmitting RF signals.

20 Claims, 6 Drawing Sheets

BIAS CIRCUIT FOR SUPPLYING A BIAS CURRENT TO AN RF POWER AMPLIFIER

BACKGROUND OF THE INVENTION

I. Field of the Invention

The invention relates to an RF power amplifier, and in particular, but not exclusively, to a bias circuit for supplying a bias current to an RF power amplifier.

II. Description of the Prior Art

A suitable bias current supplied to an RF power amplifier is one of the most important factors for determining the performance of the RF power amplifier. An RF power amplifier may require different quiescent currents for transmitting RF signals with different power levels depending upon different needs of the applications. Therefore, how to design a bias circuit that can supply a bias current to the RF power amplifier according to a required power level of the RF signals becomes a very important topic.

SUMMARY OF THE INVENTION

The present invention discloses a bias circuit for supplying a bias current to an RF power amplifier by using multiple voltage reference circuits coupled between a base terminal of a bipolar transistor and a power supply for generating a bias current to the RF power amplifier, and an amount of the bias current supplied to the RF power amplifier can be configured in multiple modes through transistor switches that are controlled by mode control signals, so that the bias current supplied to the RF power amplifier can be adjusted according to a required power level of the RF signals. In addition, the bias current can be turned off by another transistor switch that is controlled by a power control signal for saving power when the RF power amplifier is not transmitting RF signals.

The present invention discloses a bias circuit for supplying a bias current to an RF power amplifier, said bias circuit comprising: a first bipolar transistor, wherein the emitter terminal of the first bipolar transistor is electrically coupled to the RF power amplifier for supplying a bias current to the RF power amplifier; a first voltage reference circuit, wherein a first terminal of the first voltage reference circuit is electrically coupled to a base terminal of the first bipolar transistor through a first resistive component, and a second terminal of the first voltage reference circuit is electrically coupled to a ground; and a second voltage reference circuit, wherein a first terminal of the second voltage reference circuit is electrically coupled to the first terminal of the first voltage reference circuit transistor through a second resistive component, and a second terminal of the second voltage reference circuit is electrically coupled to the ground, wherein the second voltage reference circuit comprises a first transistor switch that is controlled by a control signal for turning on or turning off the first transistor switch, wherein when the first transistor switch is turned on, the second voltage reference circuit is operative so that the bias voltage at a gate terminal of the first bipolar transistor can be reduced so as to allow the RF amplifier to operate at a lower quiescent current, and when the first transistor switch is turned off, the second voltage reference circuit is not operative so that the bias voltage at the gate terminal of the first bipolar transistor can be increased so as to allow the RF amplifier to operate at a higher quiescent current.

In one embodiment, the bias circuit comprises a second transistor switch controlled by a second control signal for turning on or turning off the second transistor switch, wherein when the second transistor switch is turned on, the base terminal of the first bipolar transistor is electrically connected to a power supply through the second transistor switch so as to supply the bias current to the RF power amplifier.

In one embodiment, the first transistor switch is a first field-effect transistor, wherein a voltage at the gate terminal of the first field-effect transistor is controlled by a first control signal for turning on or turning off first field-effect transistor.

In one embodiment, the second reference voltage comprises a second bipolar transistor, wherein a collector terminal of the second bipolar transistor is electrically coupled to a base terminal of the second bipolar transistor via a channel path of a first field-effect transistor, wherein when the first field-effect transistor is turned on, the second voltage reference circuit is operative, and wherein when the first field-effect transistor is turned off, the second bipolar transistor is not operative.

In one embodiment, the second reference voltage comprises a second bipolar transistor and a third bipolar transistor, wherein a collector terminal of the second bipolar transistor is electrically coupled to a base terminal of the second bipolar transistor, and a collector terminal of the third bipolar transistor is electrically coupled to a base terminal of the third bipolar transistor, wherein an emitter terminal of the second bipolar transistor is electrically coupled to the collector terminal of the third bipolar transistor via a channel path of the first field-effect transistor, wherein when the first field-effect transistor is turned on, the second voltage reference circuit is operative, and when the first field-effect transistor is turned off, the second voltage reference circuit is not operative.

In one embodiment, the second transistor switch is a second field-effect transistor, wherein a voltage at a gate terminal of the second field-effect transistor is controlled by a second control signal for turning on or turning off the second field-effect transistor, wherein when the first field-effect transistor is turned on, the base terminal of the first bipolar transistor is electrically connected to a power supply via a conductive path comprising the third resistive component, the second resistive component and the first resistive component and a channel path of the second field-effect transistor.

In one embodiment, the second resistive component is electrically coupled to the first resistive component via the channel path of the second field-effect transistor.

In one embodiment, the bias circuit comprises a third voltage reference circuit for clamping a first terminal of the third voltage reference circuit at a third reference voltage, wherein a first terminal of the third voltage reference circuit is electrically coupled to the first terminal of the second voltage reference circuit transistor through a third resistive component, and a second terminal of the third voltage reference circuit is electrically coupled to the ground, wherein the third voltage reference circuit comprises a third transistor switch controlled by a third control signal for turning on or turning off the third transistor switch, wherein when the third transistor switch is turned on, the third voltage reference circuit is operative for clamping the first terminal of the third voltage reference circuit at the third reference voltage, and when the third transistor switch is turned off, the third voltage reference circuit is not operative.

In one embodiment, the third transistor switch is a third field-effect transistor, wherein a voltage at a gate terminal of the third field-effect transistor is controlled by a third control signal for turning on or turning off the third field-effect transistor.

In one embodiment, said power supply is provided by a battery.

In one embodiment, the first bipolar transistor is made by a GaAs heterojunction-bipolar-transistor (HBT) process.

In one embodiment, the bipolar transistors and the first field-effect transistor are integrated on a single-chip integrated circuit.

In one embodiment, a bias circuit for supplying a bias current to an RF power amplifier is disclosed, wherein the bias circuit comprises: a first bipolar transistor having a base terminal, a collector terminal and an emitter terminal, wherein the emitter terminal is electrically coupled to the RF power amplifier; a first voltage reference circuit for clamping a first terminal of first voltage reference circuit at a first reference voltage, wherein the first terminal of the first voltage reference circuit is electrically coupled to the base terminal of the first bipolar transistor through a first resistive component, and a second terminal of the first voltage reference circuit is electrically coupled to a ground; and a second voltage reference circuit, for clamping a first terminal of the second voltage reference circuit at a second reference voltage, wherein the first terminal of the second voltage reference circuit is electrically coupled to the first terminal of the first voltage reference circuit transistor through a second resistive component, and a second terminal of the second voltage reference circuit is electrically coupled to the ground, wherein the second voltage reference circuit comprises a first transistor switch that is controlled by a control signal for turning on or turning off the first transistor switch, wherein when the first transistor switch is turned on, the second voltage reference circuit is operative for clamping the first terminal of the second voltage reference circuit at the second reference voltage, and when the first transistor switch is turned off, the second voltage reference circuit is not operative; and a third voltage reference circuit, for clamping a first terminal of the third voltage reference circuit at a third reference voltage, wherein the first terminal of the third voltage reference circuit is electrically coupled to the first terminal of the second voltage reference circuit transistor through a third resistive component, and a second terminal of the third voltage reference circuit is electrically coupled to the ground, wherein the third voltage reference circuit comprises a second transistor switch controlled by a second control signal for turning on or turning off the second transistor switch, wherein when the second transistor switch is turn on, the third voltage reference circuit is operative for clamping the first terminal of the third voltage reference circuit at the third reference voltage, and when the third transistor switch is turned off, the third voltage reference circuit is not operative.

In one embodiment, a bias circuit for supplying bias currents to an RF power amplifier is disclosed, wherein the bias circuit comprises: a power-stage bias circuit, wherein the power-stage bias circuit comprises a first bipolar transistor, wherein an emitter terminal of the first bipolar transistor is electrically coupled to a base terminal of the RF power amplifier for supplying a first bias current to the RF power amplifier, wherein the power-stage bias circuit comprises a first voltage reference circuit comprising a first transistor switch that is controlled by a first control signal for turning on or turning off the first transistor switch for setting the first voltage reference circuit in either an operative state or an inoperative state and a second voltage reference circuit comprising a second transistor switch that is controlled by a second control signal for turning on or turning off the second transistor switch for setting the second voltage reference circuit in either an operative state or an inoperative state; a first-stage bias circuit, wherein the first-stage bias circuit comprises a second bipolar transistor, wherein the emitter terminal of the second bipolar transistor is electrically coupled to the base terminal of a pre-amplifier, wherein the first-stage bias circuit comprises a third voltage reference circuit comprising a third transistor switch that is controlled by a third control signal for turning on or turning off the third transistor switch for setting the third voltage reference circuit in either an operative state or an inoperative state; wherein the collector terminal of the second bipolar transistor is electrically coupled to the base terminal of the first bipolar transistor, and the collector terminal of the pre-amplifier is coupled to the base terminal of the RF power amplifier for supplying a second bias current to the RF power amplifier, wherein a total amount of the first bias current and the second bias current supplied to the RF power amplifier is capable of being adjusted through different states of the first and the second control signals.

The detailed technology and above preferred embodiments implemented for the present invention are described in the following paragraphs accompanying the appended drawings for people skilled in the art to well appreciate the features of the claimed invention.

BRIEF DESCRIPTION OF DRAWINGS

The foregoing aspects and many of the accompanying advantages of this invention will become more readily appreciated as the same becomes better understood by reference to the following detailed description when taken in conjunction with the accompanying drawings, wherein.

DETAILED DESCRIPTION OF EMBODIMENT

The detailed explanation of the present invention is described as follows. The described preferred embodiments are presented for purposes of illustrations and description, and they are not intended to limit the scope of the present invention.

Figure 1:
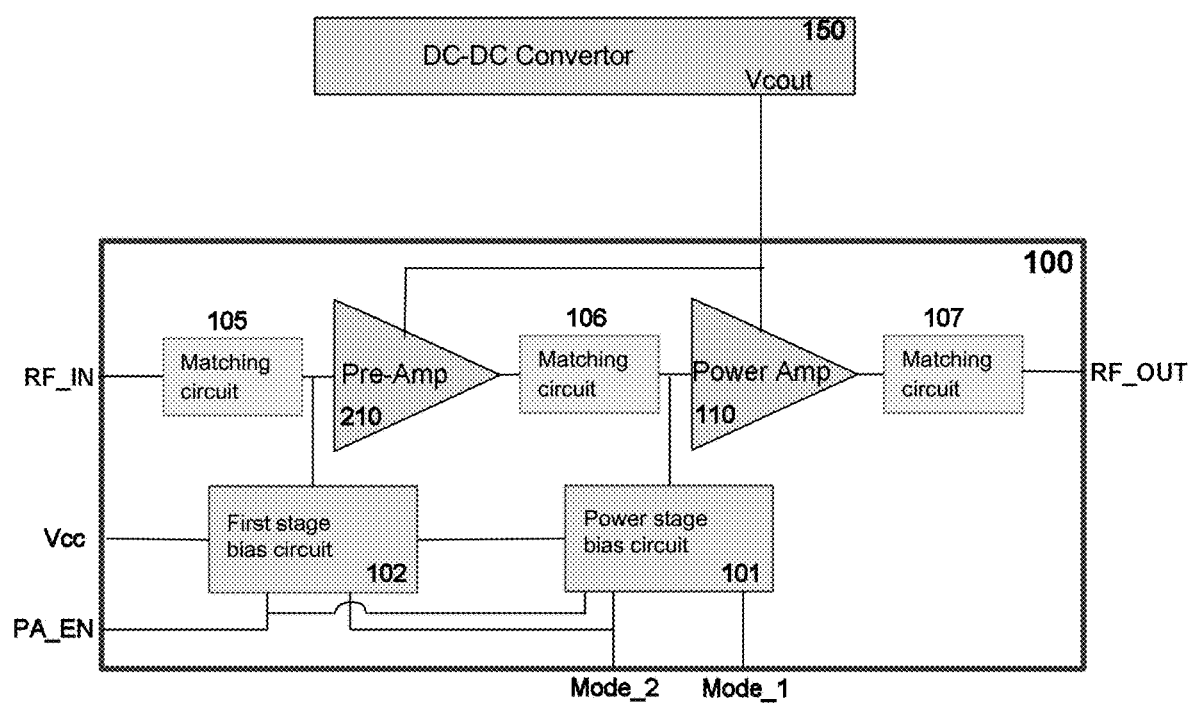
FIG. 1 illustrates a block diagram containing bias circuits for supplying bias currents to an RF power amplifier in accordance with one embodiment of the present invention.

FIG. 1 illustrates a block diagram of an RF power amplifier (PA) module 100 in accordance with one embodiment of the present invention. As shown in FIG. 1, a PA module 100 is powered by a power supply Vcout outputted from a DC-DC converter 150, wherein a voltage level of the power supply Vcout from the DC-DC converter 150 can be adjusted by a system based on the required transmitting power level of the RF signals. The PA module 100 comprises a pre-amplifier 210 and a power amplifier 110, wherein a pre-amplifier 210 is coupled to the inputted RF signal RF_IN via a matching circuit 105; and the RF power amplifier 110 is coupled to the pre-amplifier 210 via a matching circuit 106 to further amplify the RF signals outputted from the pre-amplifier 210, and then the RF power amplifier 110 outputs the RF signal RF_OUT via a matching circuit 107.

As shown in FIG. 1, a first stage bias circuit 102 is used to supply a bias current to the pre-amplifier 210 and a power-stage bias circuit 101 is used to supply a bias current to the RF power amplifier 110, wherein the first-stage bias circuit 102 and the power-stage bias circuit 101 are powered by a power supply Vcc. As shown in FIG. 1, a power control signal PA_EN is used to enable the first-stage bias circuit 102 and the power-stage bias circuit 101. Two mode control signals Mode_1, Mode_2 are used to configure the first-stage bias circuit 102 and the power-stage bias circuit 101 in multiple modes so that the bias current supplied to the pre-amplifier 210 and the RF power amplifier 110 can be adjusted for setting the quiescent current of the RF power amplifier 110, according to the required transmitting power level of the RF signals. In one embodiment, only mode control signals Mode_1 can be used for adjusting the quiescent current of the RF power amplifier 110 for transmitting RF signals. In one embodiment, two mode control signals Mode_1, Mode_2 are used for adjusting the quiescent current of the RF power amplifier 110 for transmitting RF signals. The present invention is not limited to the number of the mode control signals, and the number of the mode control signals can be increased as needed.

Figure 2A:
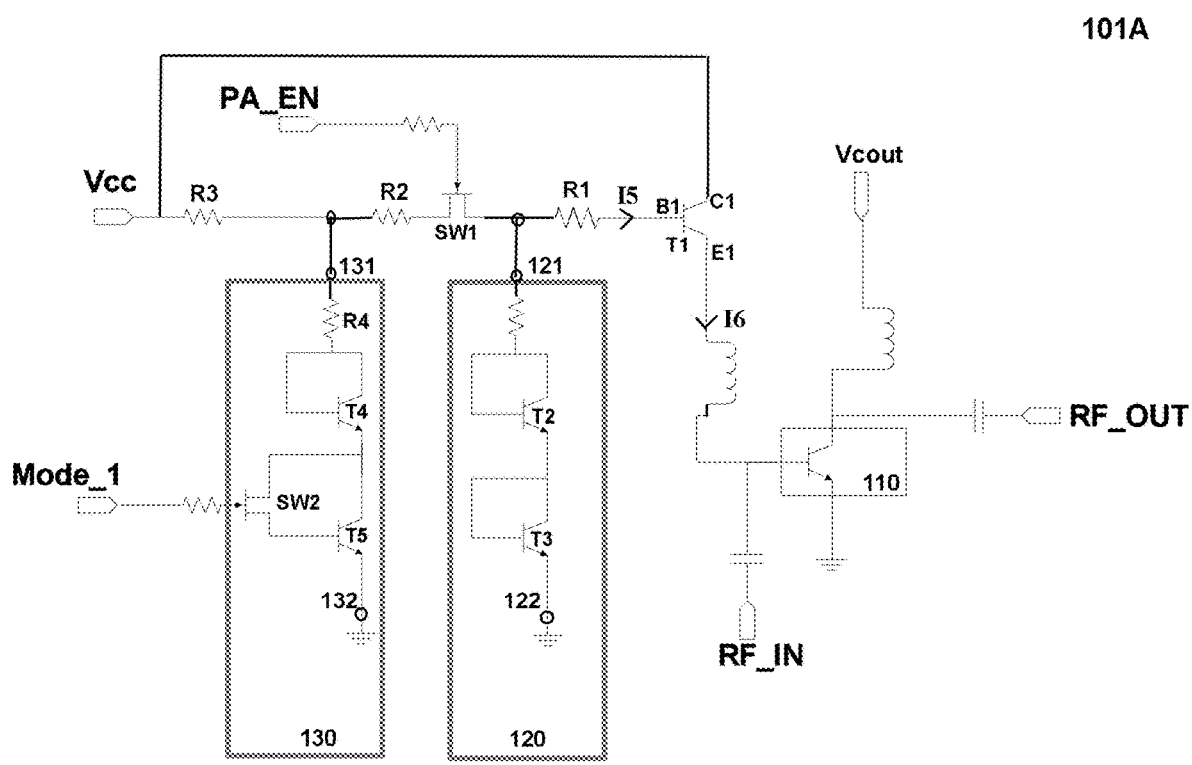
FIG. 2A illustrates an exemplary circuit of the bias circuit in FIG. 1.

FIG. 2A illustrates a bias circuit 101A for implementing the bias circuit 101 in FIG. 1 according to one embodiment of the present invention. The bias circuit 101 comprises a first bipolar transistor T1, a first voltage reference circuit 120 and a second voltage reference circuit 130. The first bipolar transistor T1 has a base terminal B1, a collector terminal C1, and an emitter terminal E1. The emitter terminal E1 of the first bipolar transistor T1 is electrically coupled to the RF power amplifier 110 for supplying a bias current 16 to the RF power amplifier 110. A power supply Vcc is electrically coupled to the collector terminal C1 of the first bipolar transistor T1 via a conductive path comprising the resistive components R1, R2, R3 and a first transistor switch such as a field-effect transistor switch SW1 for generating a bias current 15 to base terminal B1 of the first bipolar transistor T1. A first terminal 121 of the first voltage reference circuit 120 is electrically coupled to the base terminal B1 of the first bipolar transistor T1 through the first resistive component R1, and a second terminal 122 of the first voltage reference circuit 120 is electrically coupled to a ground. The first voltage reference circuit 120 clamps the first terminal 121 of the first voltage reference circuit 120 at a first reference voltage. A first terminal 131 of the second voltage reference circuit 130 is electrically coupled to the first terminal 121 of the first voltage reference circuit 120 through a second resistive component R2 and a transistor switch such as a field-effect transistor switch SW2, and a second terminal 132 of the second voltage reference circuit 130 is electrically coupled to the ground. The second voltage reference circuit 130 clamps the first terminal 131 of the second voltage reference circuit 130 at a second reference voltage. The first terminal 131 of the second voltage reference circuit 130 is electrically coupled to the power supply Vcc through the third resistive component R3. When the field-effect transistor switch SW1 is turned on, a bias current 15 will be supplied to the base terminal B1 of the first bipolar transistor T1 so that the bias current 16 will be supplied to the RF power amplifier 110 through the emitter terminal E1 of the first bipolar transistor T1; and when the field-effect transistor switch SW1 is turned off, the bias current 15 will not be supplied to the base terminal B1 of the first bipolar transistor T1 and the bias current 16 will not be supplied to the RF power amplifier 110, as shown in FIG. 2A. In one embodiment, the field-effect transistor switch SW1 is an N-channel field-effect transistor, and a gate terminal of the N-channel field-effect transistor is controlled by the control signal PA_EN, wherein when the control signal PA_EN is high, the field-effect transistor SW1 will be turned on, and when the control signal PA_EN is low, the first field-effect transistor SW1 will be turned off. In one embodiment, the first field-effect transistor is a depletion-mode field-effect transistor.

As shown in FIG. 2A, the field-effect transistor switch SW2 is used to set the second voltage reference circuit 130 in an operative state or an inoperative state, wherein when the field-effect transistor switch SW2 is turned on, wherein both of the first voltage reference circuit 120 and the second voltage reference circuit are operating for providing a lower voltage at the base terminal of the first bipolar transistor T1 so as to allow the RF power amplifier 110 to operate at a lower quiescent current; and when the field-effect transistor switch SW2 is turned off, the second voltage reference circuit 130 is not operative, wherein the first voltage reference circuit 120 is operating for providing a higher voltage at the base terminal of the first bipolar transistor T1 so as to allow the RF power amplifier 110 to operate at a higher quiescent current.

As shown in FIG. 2A, the second reference voltage 130 comprises a bipolar transistor T4 and a bipolar transistor T5, wherein a collector terminal of the bipolar transistor T4 is electrically coupled to a base terminal of the bipolar transistor T4, an emitter terminal of the bipolar transistor T4 is electrically coupled to the base terminal of the bipolar transistor T5 via the channel path of the field-effect transistor switch SW2. In one embodiment, the field-effect transistor switch SW2 is an N-channel field-effect transistor, and a gate terminal of the N-channel field-effect transistor is controlled by a control signal Mode_1, wherein when the control signal Mode_1 is high, the N-channel field-effect transistor will be turned on, and when the Mode_1 is low, the N-channel field-effect transistor will be turned off. In one embodiment, the field-effect transistor switch SW2 is a depletion-mode field-effect transistor.

Figure 2B:
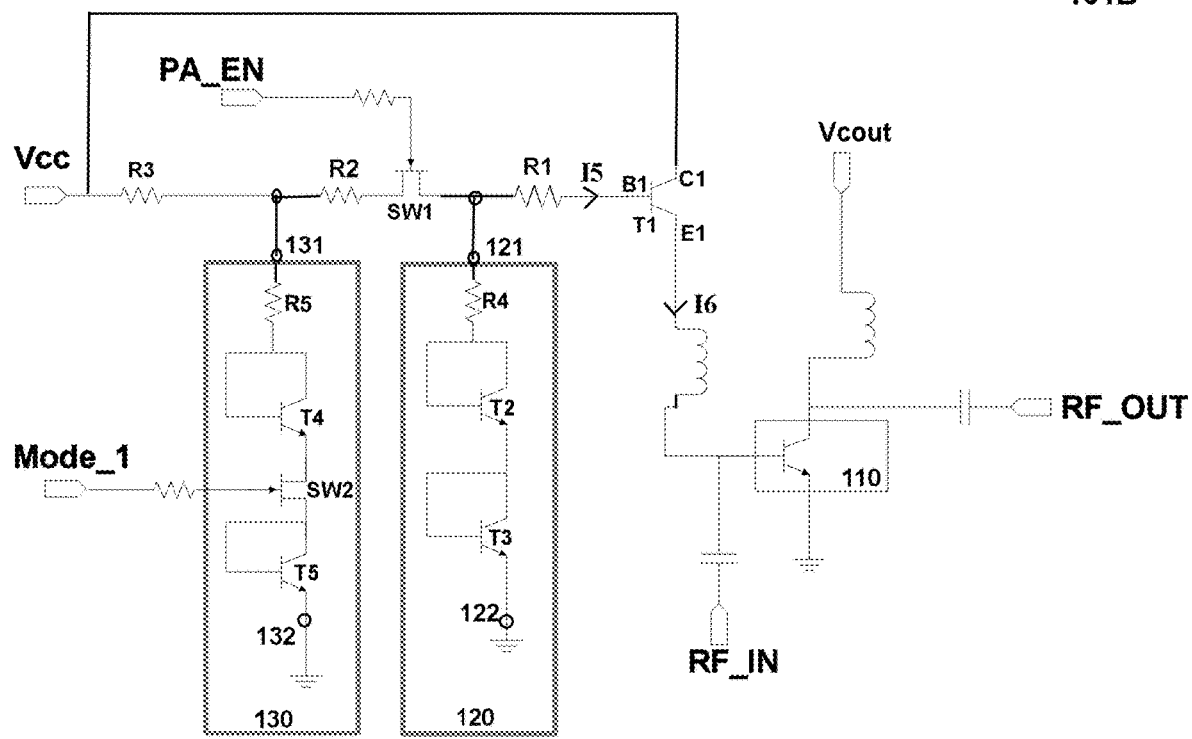
FIG. 2B illustrates another exemplary circuit of the bias circuit in FIG. 1.

FIG. 2B illustrates a bias circuit 101B for implementing the bias circuit 101 in FIG. 1 according to one embodiment of the present invention. As shown in FIG. 2B, the second reference voltage 130 comprises a bipolar transistor T4 and a bipolar transistor T5, wherein a collector terminal of the bipolar transistor T4 is electrically coupled to a base terminal of the bipolar transistor T4, the collector terminal of the bipolar transistor T5 is electrically coupled to the base terminal of the bipolar transistor T5, and the emitter terminal of the bipolar transistor T4 is electrically coupled to the collector terminal of the bipolar transistor T5 via a channel path of the field-effect transistor switch SW2, wherein when the field-effect transistor switch SW2 is turned on, the second voltage reference circuit is operative, and wherein when the field-effect transistor switch SW2 is turned off, the second voltage reference circuit is not operative.

Figure 2C:
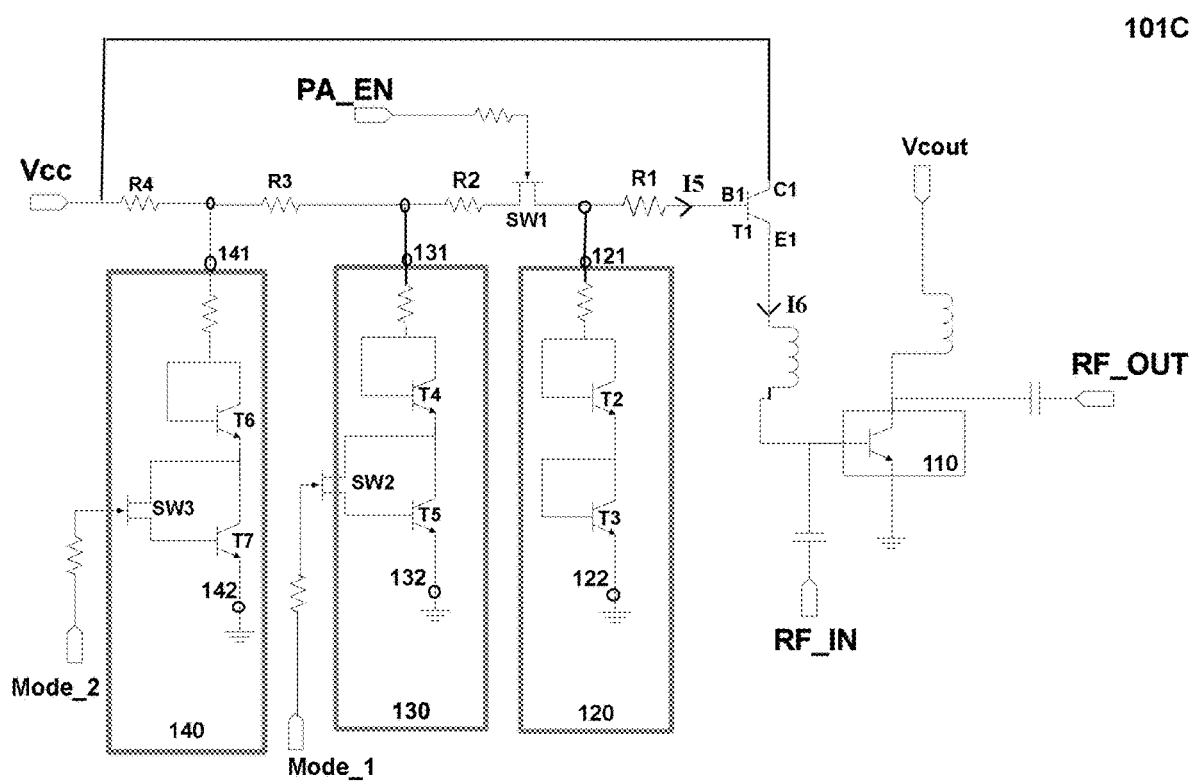
FIG. 2C illustrates another exemplary circuit of the bias circuit in FIG. 1.

FIG. 2C illustrates a bias circuit 101C for implementing the bias circuit 101 in FIG. 1 according to one embodiment of the present invention. As shown in FIG. 2C, the bias circuit 101 further comprises a third voltage reference circuit 140 for clamping a first terminal 141 of the third voltage reference circuit 140 at a third reference voltage, wherein the first terminal 141 of the third voltage reference circuit 140 is electrically coupled to the first terminal 131 of the second voltage reference circuit 130 through a third resistive component R3, and a second terminal 142 of the third voltage reference circuit 140 is electrically coupled to the ground. The third voltage reference circuit 140 comprises a transistor switch such as a field-effect transistor switch SW3 controlled by a control signal MODE_2 for turning on or turning off the field-effect transistor switch SW3, wherein when the field-effect transistor switch SW3 is turned on, the third voltage reference circuit 140 is operative, and when the field-effect transistor switch SW3 is turned off, the third voltage reference circuit 140 is not operative.

As shown in FIG. 2C, the third voltage reference circuit 140 comprises a bipolar transistor T6 and a bipolar transistor T7, wherein a collector terminal of the bipolar transistor T6 is electrically coupled to a base terminal of the bipolar transistor T6, an emitter terminal of the bipolar transistor T6 is electrically coupled to the collector terminal of the bipolar transistor T7 via a channel path of the field-effect transistor switch SW3, wherein when the field-effect transistor switch SW3 is turned on, the third voltage reference circuit 140 is operative, and wherein when the field-effect transistor switch SW3 is turned off, the third voltage reference circuit 140 is not operative. In one embodiment, the field-effect transistor switch SW3 is an N-channel field-effect transistor, and a gate terminal of the N-channel field-effect transistor is controlled by a control signal MODE_2, wherein when the control signal MODE_2 is high, the N-channel field-effect transistor will be turned on, and when the MODE_2 is low, the N-channel field-effect transistor will be turned off. In one embodiment, the field-effect transistor switch SW3 is a depletion-mode field-effect transistor.

Figure 2D:
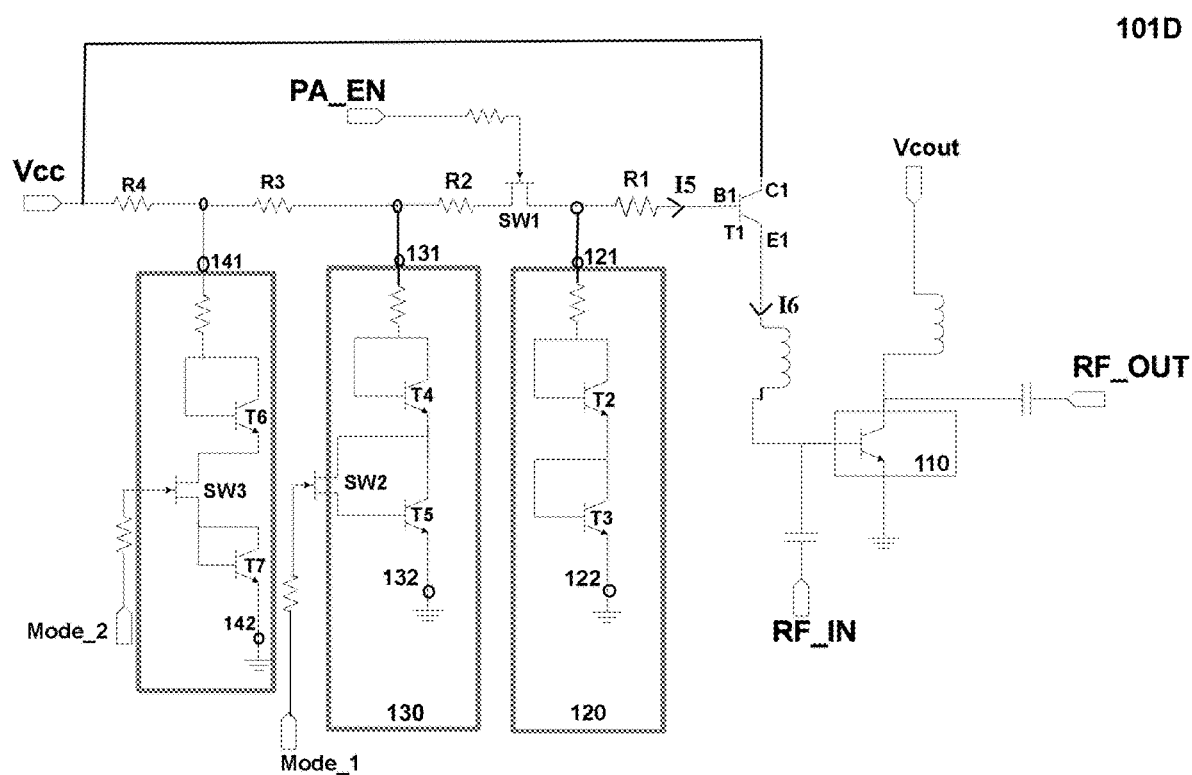
FIG. 2D illustrates another exemplary circuit of the bias circuit in FIG. 1.

FIG. 2D illustrates a bias circuit 101D for implementing the bias circuit 101 in FIG. 1 according to one embodiment of the present invention. As shown in FIG. 2D, the collector terminal of the bipolar transistor T6 is electrically coupled to the base terminal of the bipolar transistor T6, the collector terminal of the bipolar transistor T7 is electrically coupled to the base terminal of the bipolar transistor T7, and the emitter terminal of the bipolar transistor T6 is electrically coupled to the collector terminal of the bipolar transistor T7 via a channel path of the field-effect transistor switch SW3, wherein when the field-effect transistor switch SW3 is turned on, the third voltage reference circuit 140 is operative, and wherein when the field-effect transistor switch SW3 is turned off, the third voltage reference circuit 140 is not operative.

The present invention is not limited to the number of the voltage reference circuits for adjusting the quiescent current of the RF power amplifier, and the present invention is not limited to the number of the mode control signals for adjusting the quiescent current of the RF power amplifier, and the number of the mode control signals can be increased as needed.

Figure 2E:
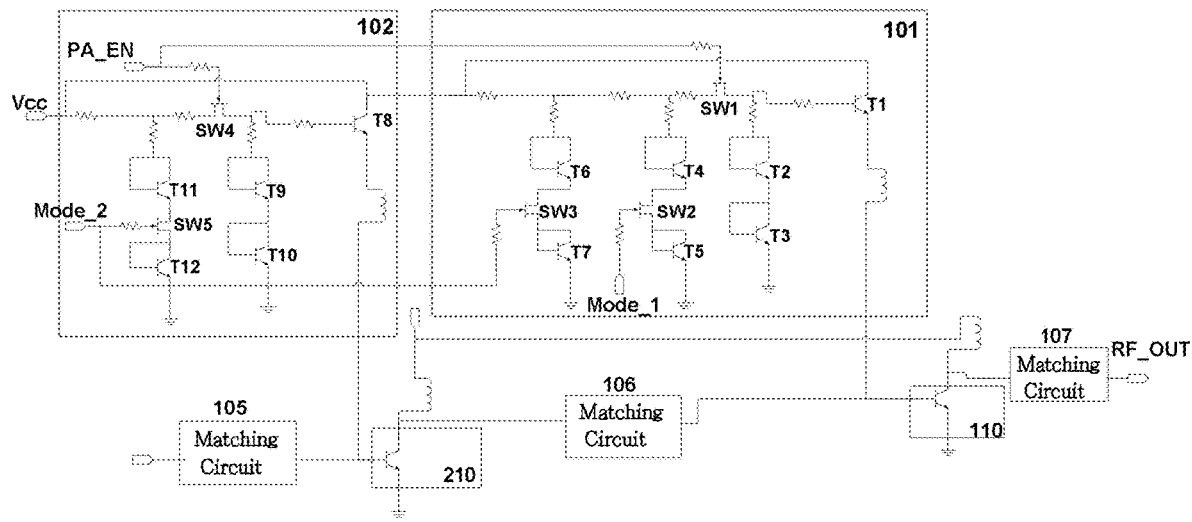
FIG. 2E illustrates an exemplary circuit including the power-stage bias circuit and the first-stage bias circuit in FIG. 1.

FIG. 2E illustrates a bias circuit 101E for supplying bias currents to an RF power amplifier 110 according to one embodiment of the present invention. The bias circuit 101E comprises: a power-stage bias circuit 101 and a first-stage bias circuit 102, wherein the power-stage bias circuit 101 comprises a first bipolar transistor T1, wherein the emitter terminal of the first bipolar transistor T1 is electrically coupled to the base terminal of the RF power amplifier 110 for supplying a first bias current to the RF power amplifier 110.

As shown in FIG. 2E, the power-stage bias circuit 101 comprises a transistor switch such as a field-effect transistor SW1 controlled by a control signal PA_EN for turning on or turning off the field-effect transistor switch SW1, wherein when the field-effect transistor switch SW1 is turned on, the base terminal of the first bipolar transistor T1 is electrically connected to the power supply Vcc through the channel path of the field-effect transistor switch SW1 so as to supply the bias current to the RF power amplifier 110.

As shown in FIG. 2E, the power-stage bias circuit 101 comprises a first voltage reference circuit comprising transistors T2, T3, a second voltage reference circuit comprising transistors T4, T5, a third voltage reference circuit comprising transistors T6, T7 and a transistor switch such as a field-effect transistor switch SW2 that is controlled by the control signal MODE_1 for turning on or turning off the field-effect transistor switch SW2 for setting the second voltage reference circuit in either an operative state or an inoperative state, and a transistor switch such as a field-effect transistor switch SW3 that is controlled by the control signal MODE_2 for turning on or turning off the field-effect transistor switch SW3 for setting the third voltage reference circuit in either an operative state or an inoperative state.

As shown in FIG. 2E, the first-stage bias circuit 102 comprises a second bipolar transistor T8, wherein an emitter terminal of the second bipolar transistor T8 is electrically coupled to a base terminal of a pre-amplifier 210. The first-stage bias circuit 102 comprises a transistor switch such as a field-effect transistor switch SW4 controlled by a control signal PA_EN for turning on or turning off the field-effect transistor switch SW4, wherein when the field-effect transistor switch SW4 is turned on, the base terminal of the second bipolar transistor T8 is electrically connected to the power supply Vcc through the field-effect transistor switch SW4.

As shown in FIG. 2E, the first-stage bias circuit 102 comprises a fourth voltage reference circuit comprising transistors T9, T10, a fifth voltage reference circuit comprising transistors T11, T12 and a transistor switch such as a field-effect transistor switch SW5 that is controlled by the control signal MODE_2 for turning on or turning off the field-effect transistor switch SW5 for setting the fifth voltage reference circuit in either an operative state or an inoperative state. The collector terminal of the second bipolar transistor T8 is electrically coupled to the base terminal of the first bipolar transistor T1, and the collector terminal of the pre-amplifier 210 is coupled to the base terminal of the RF power amplifier 110 for supplying a second bias current to the RF power amplifier 110, wherein the total amount of the first bias current and the second bias current supplied to the RF power amplifier 110 is capable of being adjusted through different states of the first and the second control signals MODE_1, MODE_2.

In one embodiment of the present invention, the bipolar NPN transistor can be made by a GaAs heterojunction-bipolar-transistor (HBT) process.

In one embodiment of the present invention, the field-effect transistor switches and the bipolar transistors are integrated on a single-chip integrated circuit.

In one embodiment of the present invention, the power supply Vcc can be provided by a battery in mobile devices such as a mobile phone, a pad or a notebook.

Please note that each of the transistor switches of the present invention is not limited to the type of the transistor, other types of transistors such as a bipolar transistor can be used as a transistor switch as well.

The present invention is not limited to the actual implementations of the voltage reference circuits and the first voltage reference circuits can be the same or different from each other based on design considerations. Please note that a resistive component in the present invention can be implemented in many forms, for example, the resistive component can be implemented by a single resistor or by using multiple resistors to form an equivalent resistance, or the resistive component can be implemented by any suitable device having resistance therein.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the claims appended hereto and their equivalents.

What is claimed is:

1. A bias circuit for supplying a bias current to an RF power amplifier, said bias circuit comprising:
    a first bipolar transistor having a base terminal, a collector terminal and an emitter terminal, wherein the emitter terminal is electrically coupled to the RF power amplifier for supplying a bias current to the RF power amplifier;
    a first voltage reference circuit for clamping a first terminal of first voltage reference circuit at a first reference voltage, wherein the first terminal of the first voltage reference circuit is electrically coupled to the base terminal of the first bipolar transistor through a first resistive component and a second terminal of the first voltage reference circuit is electrically coupled to a ground; and
    a second voltage reference circuit, for clamping a first terminal of the second voltage reference circuit at a second reference voltage, wherein the first terminal of the second voltage reference circuit is electrically coupled to the first terminal of the first voltage reference circuit through a second resistive component and a second terminal of the second voltage reference circuit is electrically coupled to the ground, wherein the second voltage reference circuit comprises a first transistor switch that is controlled by a control signal for turning on or turning off the first transistor switch, wherein when the first transistor switch is turned on, the second voltage reference circuit is operative, and when the first transistor switch is turned off, the second voltage reference circuit is not operative, for adjusting the bias current supplied to the RF amplifier.

2. The bias circuit of claim 1, further comprising a second transistor switch controlled by a second control signal for turning on or turning off the second transistor switch, wherein when the second transistor switch is turned on, the base terminal of the first bipolar transistor is electrically connected to a power supply through the second transistor switch so as to supply the bias current to the RF power amplifier.

3. The bias circuit of claim 1, wherein the first transistor switch is a first field-effect transistor, wherein a voltage at a gate terminal of the first field-effect transistor is controlled by the first control signal for turning on or turning off the first field-effect transistor.

4. The bias circuit of claim 3, wherein the second reference voltage circuit comprises a second bipolar transistor, wherein a collector terminal of the second bipolar transistor is electrically coupled to a base terminal of the second bipolar transistor via a channel path of the first field-effect transistor, wherein when the first field-effect transistor is turned on, the second voltage reference circuit is operative, and wherein when the first field-effect transistor is turned off, the second bipolar transistor is not operative.

5. The bias circuit of claim 3, wherein the second reference voltage circuit comprises a second bipolar transistor and a third bipolar transistor, wherein a collector terminal of the second bipolar transistor is electrically coupled to a base terminal of the second bipolar transistor, and a collector terminal of the third bipolar transistor is electrically coupled to a base terminal of the third bipolar transistor, wherein an emitter terminal of the second bipolar transistor is electrically coupled to the collector terminal of the third bipolar transistor via a channel path of the first field-effect transistor, wherein when the first field-effect transistor is turned on, the second voltage reference circuit is operative, and wherein when the first field-effect transistor is turned off, the second voltage reference circuit is not operative.

6. The bias circuit of claim 2, wherein the second transistor switch is a second field-effect transistor, wherein a voltage at a gate terminal of the second field-effect transistor is controlled by the second control signal for turning on or turning off the second field-effect transistor, when the first field-effect transistor is turned on, the base terminal of the first bipolar transistor is electrically connected to the power supply via a conductive path comprising the second resistive component, the first resistive component and a channel path of the second field-effect transistor.

7. The bias circuit of claim 6, wherein the second resistive component is electrically coupled to the first resistive component via the channel path of the second field-effect transistor.

8. The bias circuit of claim 1, further comprising a third voltage reference circuit for clamping a first terminal of the third voltage reference circuit at a third reference voltage, wherein the first terminal of the third voltage reference circuit is electrically coupled to the first terminal of the second voltage reference circuit through a third resistive component, and a second terminal of the third voltage reference circuit is electrically coupled to the ground, wherein the third voltage reference circuit comprises a third transistor switch controlled by a third control signal for turning on or turning off the third transistor switch, wherein when the third transistor switch is turned on, the third voltage reference circuit is operative for clamping the first terminal of the third voltage reference circuit at the third reference voltage, and when the third transistor switch is turned off, the third voltage reference circuit is not operative.

9. The bias circuit of claim 8, wherein the third transistor switch is a third field-effect transistor, wherein a voltage at a gate terminal of the third field-effect transistor is controlled by the third control signal for turning on or turning off the third field-effect transistor.

10. The bias circuit of claim 2, wherein said power supply is provided by a battery.

11. The bias circuit of claim 1, wherein the first bipolar transistor is made by a GaAs heterojunction-bipolar-transistor (HBT) process.

12. The bias circuit of claim 3, wherein the bipolar transistors and the first field-effect transistor are integrated on a single-chip integrated circuit.

13. A bias circuit for supplying a bias current to an RF power amplifier, said bias circuit comprising:
a first bipolar transistor having a base terminal, a collector terminal and an emitter terminal, wherein the emitter terminal is electrically coupled to the RF power amplifier;
a first voltage reference circuit for clamping a first terminal of a first voltage reference circuit at a first reference voltage, wherein the first terminal of the first voltage reference circuit is electrically coupled to the base terminal of the first bipolar transistor through a first resistive component, and a second terminal of the first voltage reference circuit is electrically coupled to a ground;
a second voltage reference circuit, for clamping a first terminal of the second voltage reference circuit at a second reference voltage, wherein the first terminal of the second voltage reference circuit is electrically coupled to the first terminal of the first voltage reference circuit through a second resistive component, and a second terminal of the second voltage reference circuit is electrically coupled to the ground, wherein the second voltage reference circuit comprises a first transistor switch that is controlled by a first control signal for turning on or turning off the first transistor switch, wherein when the first transistor switch is turned on, the second voltage reference circuit is operative for clamping the first terminal of the second voltage reference circuit at the second reference voltage, and when the first transistor switch is turned off, the second voltage reference circuit is not operative; and
a third voltage reference circuit, for clamping a first terminal of the third voltage reference circuit at a third reference voltage, wherein the first terminal of the third voltage reference circuit is electrically coupled to the first terminal of the second voltage reference circuit through a third resistive component, and a second terminal of the third voltage reference circuit is electrically coupled to the ground, wherein the third voltage reference circuit comprises a second transistor switch controlled by a second control signal for turning on or turning off the second transistor switch, wherein when the second transistor switch is turned on, the third voltage reference circuit is operative for clamping the first terminal of the third voltage reference circuit at the third reference voltage, and when the third transistor switch is turned off, the third voltage reference circuit is not operative.

14. The bias circuit of claim 13, further comprising a third transistor switch controlled by a third control signal for turning on or turning off the third transistor switch, wherein when the third transistor switch is turned on, the base terminal of the first bipolar transistor is electrically connected to a power supply through the third transistor switch so as to supply the bias current to the RF power amplifier.

15. The bias circuit of claim 13, wherein each of said transistor switches is a field-effect transistor.

16. The bias circuit of claim 15, wherein the bipolar transistors and the field-effect transistors are integrated on a single-chip integrated circuit.

17. A bias circuit for supplying bias currents to an RF power amplifier, said bias circuit comprising:
a power-stage bias circuit, wherein the power-stage bias circuit comprises a first bipolar transistor, wherein an emitter terminal of the first bipolar transistor is electrically coupled to a base terminal of the RF power amplifier for supplying a first bias current to the RF power amplifier, wherein the power-stage bias circuit comprises a first voltage reference circuit comprising a first transistor switch that is controlled by a first control signal for turning on or turning off the first transistor switch for setting the first voltage reference circuit in either an operative state or an inoperative state and a second voltage reference circuit comprising a second transistor switch that is controlled by a second control signal for turning on or turning off the second transistor switch for setting the second voltage reference circuit in either an operative state or an inoperative state;
a first-stage bias circuit, wherein the first-stage bias circuit comprises a second bipolar transistor, wherein an emitter terminal of the second bipolar transistor is electrically coupled to a base terminal of a pre-amplifier, wherein the first-stage bias circuit comprises a third voltage reference circuit comprising a third transistor switch that is controlled by a third control signal for turning on or turning off the third transistor switch for setting the third voltage reference circuit in either an operative state or an inoperative state;
wherein a collector terminal of the second bipolar transistor is electrically coupled to a base terminal of the first bipolar transistor, and a collector terminal of the pre-amplifier is coupled to the base terminal of the RF power amplifier for supplying a second bias current to the RF power amplifier, wherein a total amount of the first bias current and the second bias current supplied to the RF power amplifier is capable of being adjusted through different states of the first and the second control signals.

18. The bias circuit of claim 17, further comprising a fourth transistor switch controlled by a fourth control signal for turning on or turning off the fourth transistor switch, wherein when the fourth transistor switch is turned on, the base terminal of the first bipolar transistor is electrically connected to a power supply through the fourth transistor switch.

19. The bias circuit of claim 17, wherein each of said transistor switches is a field-effect transistor.

20. The bias circuit of claim 19, wherein the bipolar transistors and the first field-effect transistor are integrated on a single-chip integrated circuit.

* * * * *